United States Patent
Gupta et al.

(10) Patent No.: US 10,839,880 B2
(45) Date of Patent: *Nov. 17, 2020

(54) LOW POWER SENSE AMPLIFIER BASED ON PHASE TRANSITION MATERIAL

(71) Applicant: The Penn State Research Foundation, University Park, PA (US)

(72) Inventors: Sumeet Kumar Gupta, State College, PA (US); Ahmedullah Aziz, State College, PA (US); Nikhil Shukla, South Bend, IN (US); Suman Datta, South Bend, IN (US); Xueqing Li, State College, PA (US); Vijaykrishnan Narayanan, University Park, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/263,644

(22) Filed: Jan. 31, 2019

(65) Prior Publication Data

US 2019/0172514 A1    Jun. 6, 2019

Related U.S. Application Data

(63) Continuation of application No. 15/614,261, filed on Jun. 5, 2017, now Pat. No. 10,262,714.

(Continued)

(51) Int. Cl.
*G11C 11/16* (2006.01)
*G11C 13/00* (2006.01)
*G11C 7/06* (2006.01)

(52) U.S. Cl.
CPC .......... *G11C 11/1673* (2013.01); *G11C 7/062* (2013.01); *G11C 13/0002* (2013.01); *G11C 13/004* (2013.01); *G11C 13/0007* (2013.01)

(58) Field of Classification Search
CPC ............ G11C 11/1673; G11C 13/0002; G11C 13/0007; G11C 13/004; G11C 7/062

(Continued)

(56) References Cited

U.S. PATENT DOCUMENTS 5,418,487 A * 5/1995 Armstrong, II ........ G11C 17/18
    326/38
5,886,541 A * 3/1999 Asato ...................... H03K 3/037
    326/17

(Continued)

OTHER PUBLICATIONS

W. G. Wang et al, "Voltage-induced switching in magnetic tunnel junctions with perpendicular magnetic anisotropy", J. Phys. D: Appl. Phys. 46, (2013) 074004, 12 pages.

(Continued)

*Primary Examiner* — Sung Il Cho
(74) *Attorney, Agent, or Firm* — Buchanan Ingersoll & Rooney PC (57) ABSTRACT

A sense amplifier utilizes a phase transition material (PTM) in conjunction with CMOS circuits to provide a precise sensing threshold. The sense amplifier can be used in memory applications to sense states of stored bits with high accuracy and robustness. In one sense amplifier, a first diode-connected transistor has gate and drain nodes coupled to an input node of the sense amplifier, a second transistor has a gate node coupled to the gate node of the first diode-connected transistor, and the PTM is coupled to the source node of the second transistor. In another sense amplifier, a first transistor has a gate node coupled to an input node of the sense amplifier, a PTM is coupled to the source node of the first transistor, and an output stage including an inverter is coupled between a drain node of the first transistor and an output node of the sense amplifier.

20 Claims, 7 Drawing Sheets

Related U.S. Application Data (60) Provisional application No. 62/346,207, filed on Jun. 6, 2016.

(58) Field of Classification Search
USPC .......................................................... 365/148
See application file for complete search history.

(56) References Cited

U.S. PATENT DOCUMENTS

| | | | | |
|---|---|---|---|---|
| 6,906,557 | B1* | 6/2005 | Parker | G11C 17/18 323/316 |
| 7,760,536 | B2 | 7/2010 | Boas et al. | |
| 8,259,515 | B2* | 9/2012 | Bedeschi | G11C 13/0004 365/189.15 |
| 9,589,662 | B2* | 3/2017 | Kim | G11C 17/165 |
| 2006/0062066 | A1 | 3/2006 | Garni | |
| 2006/0126387 | A1 | 6/2006 | Kim et al. | |
| 2006/0221678 | A1* | 10/2006 | Bedeschi | G11C 13/0004 365/163 |
| 2007/0047160 | A1* | 3/2007 | Philipp | G11C 13/0004 361/18 |
| 2009/0268538 | A1* | 10/2009 | Fukushima | G11C 13/004 365/208 |
| 2014/0003160 | A1 | 1/2014 | Trivedi et al. | |
| 2014/0036602 | A1 | 2/2014 | Yuanye Wang et al. | |
| 2014/0286082 | A1 | 9/2014 | Takahashi et al. | |
| 2015/0055397 | A1 | 2/2015 | Yi et al. | |
| 2015/0091067 | A1* | 4/2015 | Pillarisetty | H01L 45/1616 257/288 |
| 2015/0221365 | A1* | 8/2015 | Park | G11C 29/021 365/163 |
| 2015/0228333 | A1* | 8/2015 | Chou | G11C 7/12 365/148 |
| 2016/0225818 | A1 | 8/2016 | Toh et al. | |
| 2018/0158496 | A1* | 6/2018 | Sugahara | H01L 27/228 |

OTHER PUBLICATIONS

L. Liu et al, "Spin-Torque Switching with the Giant Spin Hall Effect of Tantalum" Science, (2012), vol. 336, May 4, 2012, pp. 555-558.

M. Sharad et al, "Spin Neuron for Ultra Low Power Computational Hardware" DRC, IEEE, 2012, pp. 221-222.

Y. Kim et al., "DSH-MRAM: Differential Spin Hall MRAM for On-CHip Memories", IEEE Electron Device Letters, vol. 34, No. 10, Oct. 2013, pp. 1259-1261.

Y. Kim et al., "Write-Optimized Reliable Design of STT MRAM", ISLPED, Jul. 30-Aug. 1, 2012, pp. 3-8.

K.-W. Kwon et al, "AWARE (Asymmetric Write Architecture with REdundant blocks): A high Write Speed STT-MRAM Cache Architecture" IEEE Transactions on Very Large Scale Intergartion Systems, vol. 22, No. 4, Apr. 2014, pp. 712-720.

T. Uemura et al, "Proposal of Four-Valued MRAM based on MTJ/RTD Structure", Proceedings of the 33rd International Symposium on Multiple-Valued Logic, 2003. 6 pgs.

A. P. Ramirez, "Colossal magnetoresistance", J. Phys: Condens Matter, 9 (1997), pp. 8171-8199.

J. Borghetti et al., "'Memristive' switches enable 'stateful' logic operations via material implication" Nature, vol. 464, Apr. 8, 2010, pp. 873-876.

M. F. Chang et al, "Challenges and Circuit Techniques for Energy-Efficient On-Chip Nonvolatile Memory Using Memristive Devices" IEEE Journal on Emerging and Selected Topics in Circuits and Systems, vol. 5, No. 2, Jun. 2015. pp. 183-193.

M. E Chang et al., "An Offset-Tolerant Fast-Random-Read Current-Sampling-Based Sense Amplifier for Small-Cell-Current Nonvolatile Memory" IEEE Journal of Solid-State Circuits, vol. 48, No. 3, Mar. 2013, pp. 864-877.

S. Motoman et al, "A Novel Slope Detection Technique for Robust STTRAM Sensing" Symposium on Low Power Electronics and Design, 2015. 6 pgs.

M. H. Abu-Rahma et al, "Charaterization of SRAM Sense Amplifier Input Offset for Yiled Prediction in 28nm CMOS" CICC, IEEE, (2011), 4 pgs.

Z. Wei et al, "Novel CMOS SRAM Voltage Latched Sense Amplifiers Design Based on 65 nm Technology" ICSICT (2014). 3 pgs.

B.D. Yang et al, "A Low-Power SRAM Using Heirarchical Bit Line and Local Sense Amplifiers" IEEE Journal of Solid-State Circuits, vol. 40, No. 6, Jun. 2005.

M. Jerry et al., "Phase Transition Oxide Neuron for Spiking Neural Networks", DRC, 2016. 2 pgs.

\* cited by examiner

$D_{EN}$: High, $L_{EN}$: Low
$VO_2$: Insulating

- - ▶ Small current
—▶ Medium current
⇒ Large current
✕ Transistor OFF

FIG. 3B

$D_{EN}$: High, $L_{EN}$: Low
$|V_{GS}| = V_{GS\text{-}IMT}$, $VO_2$: IMT

FIG. 3C

$D_{EN}$: Low, $L_{EN}$: Low
$|V_{GS}| > V_{GS\text{-}IMT}$, $VO_2$: Metal

FIG. 3D

$D_{EN}$: Low, $L_{EN}$: High
$I_{VO2} < I_{C\text{-}MIT}$, $VO_2$: MIT

FIG. 3E

$D_{EN}$: High, $L_{EN}$: Low
$|V_{GS}| < V_{GS\text{-}IMT}$, $VO_2$: Insulating

FIG. 3F

$D_{EN}$: Low, $L_{EN}$: Low
$|V_{GS}| < V_{GS\text{-}IMT}$, $VO_2$: Insulating

FIG. 3G

$D_{EN}$: Low, $L_{EN}$: High
$|V_{GS}| < V_{GS\text{-}IMT}$, $VO_2$: Insulating

$V_{G124} = V_{DD}$
$N_{FIN:T125} = 20$
—— $N_{FIN:T124} = 2$
- - - $N_{FIN:T124} = 3$

FIG. 6C

$V_{G125} = 0$
$N_{FIN:T125} = 3$
—— $N_{FIN:T124} = 15$
- - - $N_{FIN:T124} = 20$

LOW POWER SENSE AMPLIFIER BASED ON PHASE TRANSITION MATERIAL

CROSS-REFERENCE TO RELATED APPLICATION

This application is a continuation of U.S. application Ser. No. 15/614,261 filed Jun. 5, 2017, which claims the benefit of U.S. Provisional Application No. 62/346,207 filed Jun. 6, 2016, the entire disclosures of which are hereby incorporated by reference herein.

STATEMENT REGARDING FEDERALLY SPONSORED RESEARCH

This invention was made with government support under Grant No. HR0011-13-3-0002 awarded by the Department of Defense/Defense Advanced Research Projects Agency (DARPA). The government has certain rights in the invention.

TECHNICAL FIELD

The present disclosure relates to sense amplifiers that include a phase transition material used to provide high precision current/voltage sensing at low power.

BACKGROUND

Sense amplifiers are commonly used in memory circuits to sense the states of memory storage elements. Sense amplifiers are also commonly used in other types of circuits to sense changes in states (e.g., voltage levels or current levels) at circuit nodes. Recent advances in technology scaling, which have enabled the use of smaller device geometries and lower supply and operating voltages and currents, have also resulted in the need for high precision sense amplifiers. In particular, as supply and operating voltages and currents are lowered, the differences in current level or voltage potential between the states of memory storage elements or circuit nodes have become minute. High precision sense amplifiers are therefore needed to accurately and consistently distinguish between the different states.

Additionally, in the field of memory design, new types of non-volatile memories (NVMs) have emerged as promising next-generation storage technologies providing low stand-by leakage, high integration density, and non-volatile data retention in the event of power failure. However, in the case of NVMs such as spin-transfer torque (STT) magnetic random-access memories (MRAMs), for example, sense amplifiers cannot reliably distinguish between the states of memory elements and data sensing is therefore not robust.

A need therefore exists for new sense amplifiers that offer improvements in sensing robustness.

SUMMARY OF THE DISCLOSURE

To address the drawbacks of existing designs, amplifiers are proposed that include a phase transition material used to provide high precision current/voltage sensing at low power.

In accordance with one aspect of the disclosure, a sense amplifier includes a first diode-connected transistor having gate and drain nodes coupled to an input node of the sense amplifier, a second transistor having a gate node coupled to the gate node of the first diode-connected transistor, and a phase transition material (PTM) coupled to the source node of the second transistor.

In some examples, the sense amplifier further includes a sense amplifier output stage coupled between a drain node of the second transistor and an output node of the sense amplifier. The output stage is configured to output at the output node a sense amplifier output signal indicative of a level of a sensed signal at the input node of the sense amplifier.

The PTM may include $VO_2$, $NbO_2$, silver doped hafnium oxide, or any other material that may transition between a metallic state and an insulating state according to a level of current flow through the PTM. The PTM may have an impedance that varies non-linearly relative to a current flow through the PTM.

The sense amplifier output stage can include an inverter coupled between the drain node of the second transistor and the output node of the sense amplifier, and a first N-type transistor coupled between the drain node of the second transistor and a ground node.

The sense amplifier output stage can further include a series interconnection of first and second P-type transistors and second and third N-type transistors coupled between a power supply node and the ground node. The drain node of the second transistor is then coupled to a node common to the second P-type transistor and second N-type transistor, and gate nodes of the first P-type transistor and third N-type transistor are coupled to the output node of the sense amplifier. A controller can output a discharge enable signal to gate nodes of the first N-type transistor and the second P-type transistor, and output a latching enable signal to a gate node of the second N-type transistor.

Alternatively, the sense amplifier output stage can include an inverter coupled between the drain node of the second transistor and the output node of the sense amplifier, a first P-type transistor coupled between the drain node of the second transistor and a voltage supply node, and a series interconnection of second and third P-type transistors and first and second N-type transistors coupled between the power supply node and a ground node. The drain node of the second transistor can be coupled to a node common to the third P-type transistor and first N-type transistor, and gate nodes of the second P-type transistor and second N-type transistor can be coupled to the output node of the sense amplifier.

In accordance with another aspect of the disclosure, a non-volatile memory includes an array of non-volatile memory cells each operative to store a respective data bit, control circuitry configured to select a memory cell to be read, and a sense amplifier comprising a phase transition material (PTM) and configured to sense the data bit stored by the memory cell selected to be read.

The sense amplifier can include a first diode-connected transistor having gate and drain nodes coupled to a sense amplifier input node, a second transistor having a gate node coupled to the gate node of the first diode-connected transistor, and the PTM coupled to the source node of the second transistor.

The sense amplifier can further include an output stage coupled between a drain node of the second transistor and an output node of the sense amplifier, and configured to output at the output node of the sense amplifier a sense amplifier output signal indicative of the sensed data bit stored by the memory cell selected to be read.

The sense amplifier can include a Hybrid phase transition field-effect transistor (Hyper-FET) or Phase FET comprising the PTM. The PTM may include $VO_2$, $NbO_2$, silver doped hafnium oxide, or any other material that may transition between a metallic state and an insulating state according to a level of current flow through the PTM.

In accordance with a further aspect of the disclosure, a sense amplifier includes a first transistor having a gate node coupled to an input node of the sense amplifier, a phase transition material (PTM) coupled to the source node of the first transistor, and a sense amplifier output stage coupled between a drain node of the first transistor and an output node of the sense amplifier. The sense amplifier output stage is configured to output at the output node a sense amplifier output signal indicative of a level of a sensed signal at the input node of the sense amplifier.

The PTM may include $VO_2$, $NbO_2$, or silver doped hafnium oxide, or any other material that may transition between a metallic state and an insulating state according to a level of current flow through the PTM. The PTM may transition between a metallic state and an insulating state according to a level of current flow through the PTM.

The sense amplifier output stage may include an inverter coupled between the drain node of the first transistor and the output node of the sense amplifier, and a first N-type transistor coupled between the drain node of the first transistor and a ground node.

The sense amplifier output stage may further include a series interconnection of first and second P-type transistors and second and third N-type transistors coupled between a power supply node and the ground node. The drain node of the first transistor may be coupled to a node common to the second P-type transistor and second N-type transistor, and gate nodes of the first P-type transistor and third N-type transistor may be coupled to the output node of the sense amplifier. Additionally, controller may output a discharge enable signal to gate nodes of the first N-type transistor and the second P-type transistor, and output a latching enable signal to a gate node of the second N-type transistor.

Alternatively, the sense amplifier output stage can include an inverter coupled between the drain node of the first transistor and the output node of the sense amplifier, a first P-type transistor coupled between the drain node of the first transistor and a voltage supply node, and a series interconnection of second and third P-type transistors and first and second N-type transistors coupled between the power supply node and a ground node. The drain node of the first transistor can be coupled to a node common to the third P-type transistor and first N-type transistor, and gate nodes of the second P-type transistor and second N-type transistor can be coupled to the output node of the sense amplifier.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent similar elements throughout and wherein.

DETAILED DESCRIPTION OF THE DISCLOSURE

In the following detailed description, numerous specific details are set forth by way of examples in order to provide a thorough understanding of the relevant teachings. However, the present teachings may be practiced without such details. In other instances, well known methods, procedures, components, and/or circuitry have been described at a relatively high-level, without detail, in order to avoid unnecessarily obscuring aspects of the present teachings.

The various circuits and methods disclosed herein relate to high precision sense amplifiers, including current sense amplifiers and voltage sense amplifiers. The amplifiers draw lower power, can be implemented in a smaller footprint, and include a phase transition material (PTM) that is used to provide a precise sensing threshold. In memory circuits, the precise sensing threshold can be used to distinguish between states of memory cells.

In particular, the disclosed circuits and methods provide a sense amplifier design that utilizes the unique properties of the PTM, such as an orders of magnitude resistivity ratio between an insulating state and a metallic state and an abrupt phase transition between states, to provide sensing amplification that achieves 70%-80% lower power, 30% lower sense time, and 74% lower area compared to the standard circuit.

Prior sense amplifiers have employed complementary metal-oxide-semiconductor (CMOS) transistors for implementation and have used the gain of the transistors to amplify the sensed signal. In contrast, the circuits and methods disclosed herein employ a PTM to perform the amplification while low power CMOS circuits operate in a supporting role to initialize and latch node voltages. The disclosed circuits and methods can be used for several classes of non-volatile memories including MRAMs, resistive RAMs, phase change memories, and the like. The circuits and methods can also be employed in on-chip caches with applications towards processors, neural networks, wearable electronic systems, internet of things (IoT), health monitoring systems, and the like.

Reference now is made in detail to the examples illustrated in the accompanying drawings and discussed below.

Figure 1:
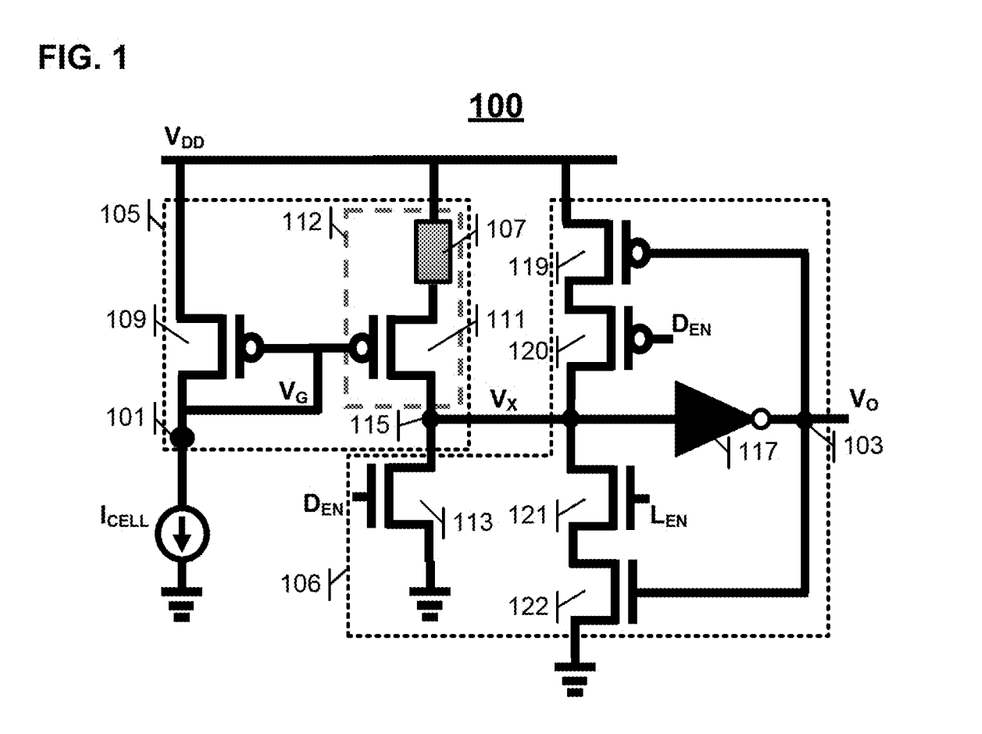
FIG. 1 is a circuit diagram of an illustrative low power sense amplifier having operation based on a phase transition material (PTM).

FIG. 1 shows an illustrative circuit diagram of a low power sense amplifier 100 whose operation is based on a phase transition material (PTM). The amplifier 100 of FIG. 1 is used to amplify and measure a current $I_{CELL}$ drawn from an input node 101 of the amplifier 100, and to produce a sensing output signal $V_O$ at the output node 103 of the amplifier 100.

The amplifier 100 includes an input stage 105 that includes the PTM 107, and an output stage 106 that includes switching circuity operative to bias the PTM 107 and process a sensing signal to produce the output signal $V_O$ at the output node 103. The input stage 105 includes a first transistor 109 that is diode-connected and has its gate and drain terminals connected to the input node 101 and its source terminal connected to the power supply terminal $V_{DD}$. The PTM 107 is connected in series between the supply terminal $V_{DD}$ and the source terminal of a second transistor 111. The second transistor 111 has its gate terminal connected to the input node 101, and its drain connected to node 115 of the output stage 106. The combination of the second transistor 111 having the PTM 107 connected in series to its source node forms a Hyper-FET or Phase FET 112.

In operation, when a current $I_{CELL}$ is applied to the input node 101 of the amplifier 100, the flow of current $I_{CELL}$ through the first transistor 109 biases the first transistor 109 such that the gate terminal of the first transistor 109 reaches a potential of $V_G$. The potential $V_G$ is applied to the gate of the second transistor 111 to bias the second transistor 111 and enable a current to flow through the second transistor 111. The amount of current flow through the second transistor 111, however, is determined according to the state (insulating or metallic/) of the PTM 107. The amount of current flow through the second transistor 111 is further determined according to the operation of the output stage 106, as detailed in more detail below in relation to FIGS. 3A-3G.

Operation of the PTM 107 will now be described in further detail in relation to FIGS. 2A-2D, while operation of the amplifier 100 will be described in more detail below in relation to FIGS. 3A-3G.

Figure 2A:
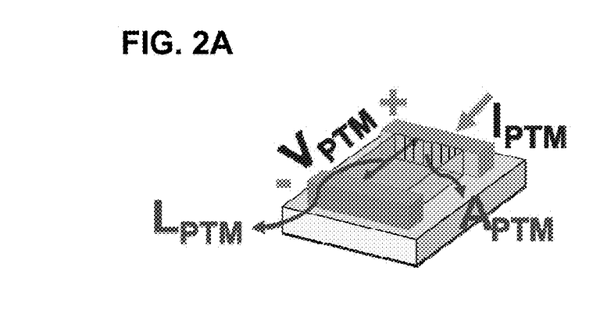
FIGS. 2A-2D are diagrams illustrating a PTM, a Hyper-FET comprising a PTM, and current-voltage (I-V) characteristics thereof.
Figure 2B:
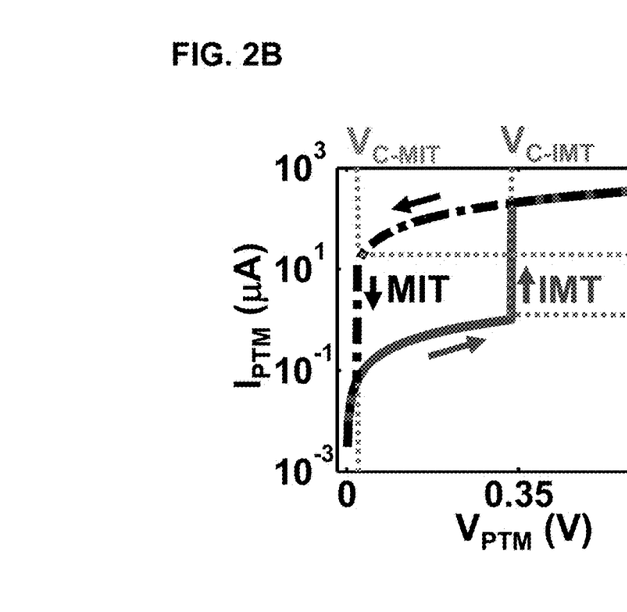

Phase transition materials (PTM) can include (i) a type of correlated electron material that exhibit insulator-metal and metal-insulator phase transitions, driven by electrical, thermal or optical stimulation or (ii) material systems that respond to the electrical current to form or break a conductive filament. Strong inherent electronic correlation in such correlated electron materials and filamentary formation/ rupture of metal atoms gives rise to such abrupt transitioning characteristics. FIG. 2A shows an illustrative PTM located on an insulating substrate. Examples of PTMs include $VO_2$, $NbO_2$, and silver (Ag) doped hafnium oxide ($HfO_2$), among others. Further examples of PTMs that can be used include copper (Cu) doped $HfO_2$, an $Ag/TiO_2$ threshold switch, or the like. FIG. 2B illustrates the current-voltage (I-V) characteristics of one illustrative PTM, $VO_2$. $VO_2$, exists in the insulating state in the absence of an electrical stimulus. As the voltage across a $VO_2$ film reaches a critical value ($V_{C-IMT}$) corresponding to a critical level of current ($I_{C-IMT}$), an insulator-to-metal transition (IMT) is triggered. Similarly, with the reduction of the voltage beyond a critical voltage level ($V_{C-MIT}$, with the corresponding current=$I_{C-MIT}$) the PTM undergoes metal-to-insulator transition (MIT). Since the critical levels for IMT and MIT are different, these materials exhibit hysteresis (i.e., $V_{C-IMT}$-$V_{C-MIT}$>0) in their current-voltage (I-V) characteristics. Due to orders of magnitude difference in insulating and metallic state resistivity of such materials, a significant change in current occurs during the phase transitions. Note, the transitions in PTMs generally occur abruptly with the change in voltage, but they are not necessarily instantaneous.

Figure 2C:
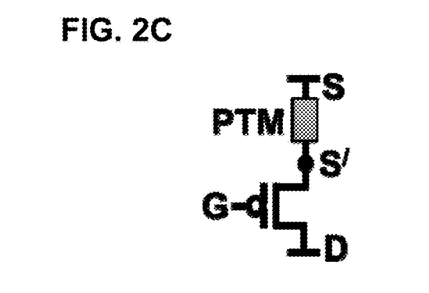
Figure 2D:
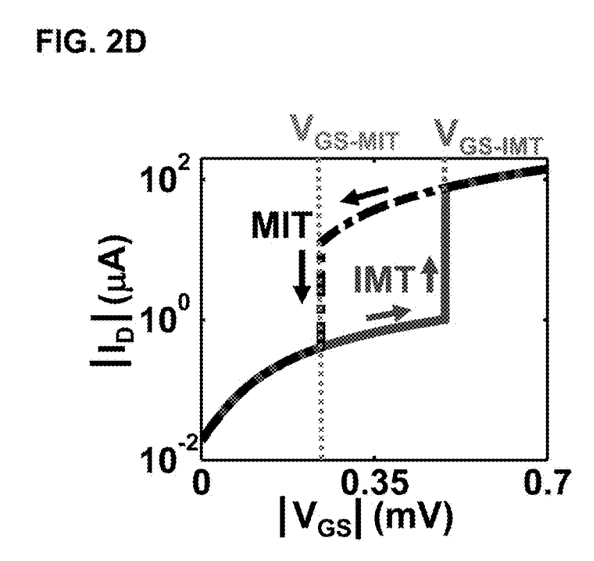

The abrupt resistivity change in PTMs can be exploited to achieve steep (e.g., sub-KT/q) subthreshold switching in a transistor. Such transistors (named 'Hyper-FET' or 'Phase FET') comprise of a PTM connected in series to the source of the transistor, as shown in FIG. 2C. The PTM electrically couples with the transistor to invoke a negative differential resistance at the source terminal of the host transistor (S'). Typical transfer characteristics ($I_D$-$V_{GS}$) of a p-type Hyper-FET are illustrated in FIG. 2D. As $V_{GS}$ is increased, the current through the transistor and PTM increases and once it becomes equal to $I_{C-IMT}$, the PTM undergoes transitions to the metallic state, which leads to an abrupt increase in the current illustrated in FIG. 2D. The gate-to-source voltage at which IMT occurs is denoted as $V_{GS-IMT}$. Similarly, when $V_{GS}$ is reduced, the reduction in current triggers MIT at a $V_{GS}$ level defined as $V_{GS-MIT}$. It may be noted that the inherent hysteretic behavior of the PTM translates to hysteresis in the $I_D$-$V_{GS}$ plot. The abrupt change in current in response to increasing $V_{GS}$ leads to interesting possibilities for low power circuit design. For example, in the amplifier 100 of FIG. 1, operation of the circuit utilizes the fact that if $V_{GS}$<$V_{GS-IMT}$, the Hyper-FET is in a high resistance state, while $V_{GS}$>$V_{GS-IMT}$ leads to the low resistance operation. In other words, the Hyper-FET serves as a near-ideal component to distinguish between a voltage lying in the range 0 to $V_{GS-IMT}$ and a voltage greater than $V_{GS-IMT}$. This characteristic can advantageously be used in the design of low power sense amplifiers, as described in further detail below.

For example, as described in relation to FIGS. 1 and 3A-3G, a current-based sense amplifier 100 is provided whose operation is based on the aforementioned properties of the PTM 107 and Hyper-FET 112. The structure of the amplifier 100 has been described above in relation to FIG. 1. The operation of the amplifier 100 will be described in further detail below in relation to FIGS. 3A-3G.

The amplifier circuit 100 provides a novel topology for a low power current-based sense amplifier based on employing the phase transition material (PTM) in conjunction with CMOS circuits. The circuit makes use of the orders-of-magnitude resistivity difference between the insulating and metallic states of PTM 107 to sense, amplify and latch the $I_{CELL}$ current, which in a memory-based application can be indicative of stored memory data. The amplifier 100 can thus be used in non-volatile memory technologies which utilize a resistance difference between two states to perform a memory read operation. Some examples of such memories include spin-transfer torque magnetic RAMs (STT-MRAMs), resistive RAMs (ReRAMs), and phase change memories (PCM). In general, a PTM such as $VO_2$ cannot be used as a non-volatile memory since it transitions into the insulating phase in the absence of a voltage and thus does not generally maintain its state. However, the distinct features of the PTM can be utilized to augment the sensing operation of a memory amplifier circuit, as detailed herein.

As noted above, the diode connected transistor 109 produces a voltage bias $V_G$ at its gate terminal connected to node 101 in response to the cell current $I_{CELL}$ flowing through the transistor 109. In memory-based application, the current level of $I_{CELL}$ is dependent on whether the memory cell being read is in a high resistive state (HRS) or a low resistive state (LRS), and the corresponding values of $V_G$ are $V_{G-LRS}$ and $V_{G-HRS}$. The node 101 is also connected to the gate terminal of the P-type Hyper-FET 112. The Hyper-FET 112 is designed (in terms of geometry of the PTM 107 and size of the transistor 111) in such a way that: $(V_{DD}-V_{G-HRS}) < |V_{GS-IMT}| < (V_{DD}-V_{G-LRS})$. In other words, the Hyper-FET 112 triggers an IMT in the PTM 107 for LRS of the memory cell, while restricting IMT for the HRS. Thus, the level of the current $I_{CELL}$ (and the associated state of the memory cell, in memory-based applications) is reflected in the phase of the PTM 107, which is then translated to a digital voltage by employing additional transistors of the output stage 106 in conjunction with the Hyper-FET 112. Transistor 113 is used to pre-discharge the Hyper-FET drain node 115 before each sensing cycle. With the voltage $V_X$ at the Hyper-FET drain node 115 equal to zero ($V_X=0$), the drain-to-source voltage of the Hyper-FET 112 ($|V_{DS}|$) is $V_{DD}$, which fixes $V_{GS-IMT}$ of the Hyper-FET and eliminates the uncertainty due to voltage fluctuations at node 115. This enables robust sense amplification. In addition, the output $V_O$ of the inverter 117 is pulled up to $V_{DD}$. Transistors 119-122 are used to latch the sensed data. During the sensing operation, the function of the inverter 117 is to convert the node voltage $V_X$ generated at node 115 into a full swing digital voltage $V_O$. Moreover, together with transistors 119, 120, 121 and 122, this inverter enables latching of the output. A discharge enable signal $D_{EN}$ controls the pre-discharge of node 115 and a latching enable signal $L_{EN}$ controls the latching of the output. The principle of operation of the circuit is illustrated in FIGS. 3A-3G and is described below in detail.

Figure 3A:
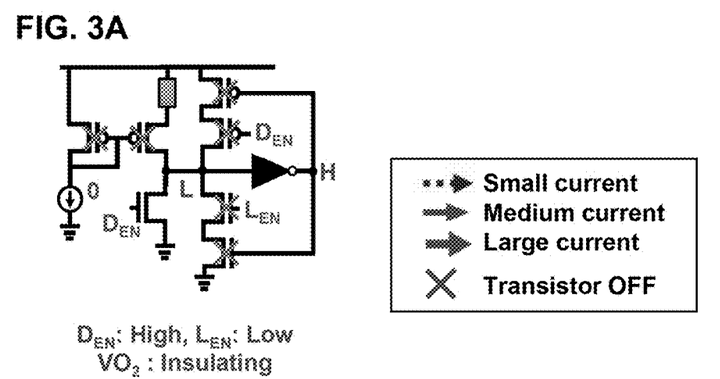
FIGS. 3A-3G are illustrative circuit diagrams each detailing a different step in the operation of the sense amplifier circuit of FIG. 1.

While the memory cell is in the unaccessed mode and $I_{CELL}=0$, as shown in FIG. 3A, the gate voltages of transistor 109 and the Hyper-FET 112 is $V_{DD}$ (i.e. $V_{GS}=0$). Hence, the sense amplifier 100 is in the inactive mode and PTM 107 remains in the insulating state.

Figure 3B:
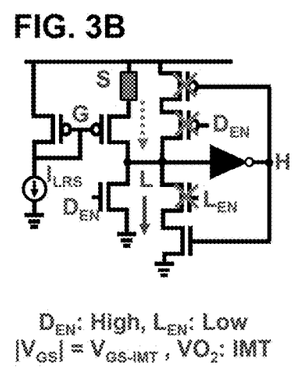
Figure 3C:
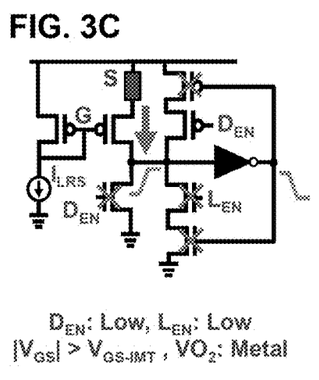
Figure 3D:
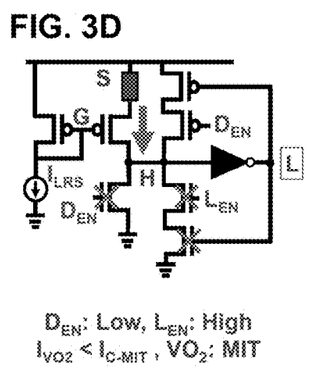

In contrast, when $I_{CELL}=I_{LRS}$ as shown in FIG. 3B, the current flow through the Hyper-FET 112 triggers IMT in PTM 107 since $|V_{GS}|=(V_{G-LRS}-V_{DD})>V_{GS-IMT}$. As the PTM 107 (e.g., $VO_2$) transitions into the metallic state, the Hyper-FET 112 starts injecting current into node 115 and charges it up. In turn, as shown in FIG. 3C, $D_{EN}$ is de-asserted during this time so that transistor 113 does not create conflict with the charging process. As the metallic state resistance of the PTM 107 is very low (e.g., approximately 1.6KΩ in an illustrative implementation), the charging occurs quickly. As $V_X$ at node 115 rises, $V_O$ keeps falling and that gradually turns ON the PMOS transistor 119, as shown in FIG. 3D. With $D_{EN}$ set to 0 and PMOS transistor 120 in the ON state, transistors 119 and 120 help the Hyper-FET 112 in charging up the node 115, making the process even faster. Note that as $V_X$ rises, $|V_{DS}|$ across the Hyper-FET 112 reduces and that eventually reduces the current flow through the Hyper-FET 112. As the current flow through the Hyper-FET falls below $I_{C-MIT}$, the PTM 107 starts undergoing MIT and transistor 111 stops contributing to the charging of node 115. However, since $I_{C-MIT}$ of these materials is typically low, the voltage at node 115 rises to a sufficiently large value (close to VDD) before the PTM 107 transitions back into the insulating state. At this point, transistors 119 and 120 along with the inverter 117 automatically latch the state at nodes 115 and 103, as shown in FIG. 3D. A low voltage signal 'L' is thereby latched at the output node 103.

Figure 3E:
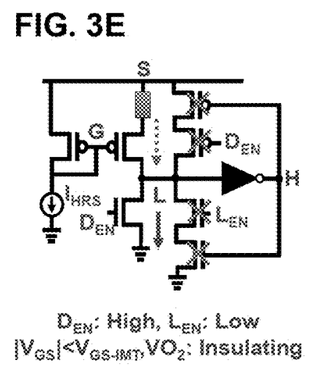
Figure 3F:
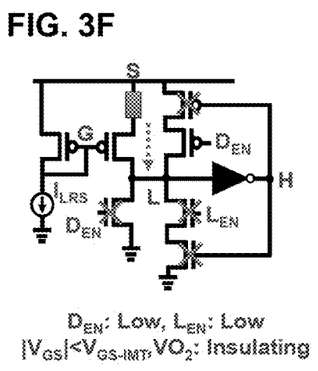
Figure 3G:
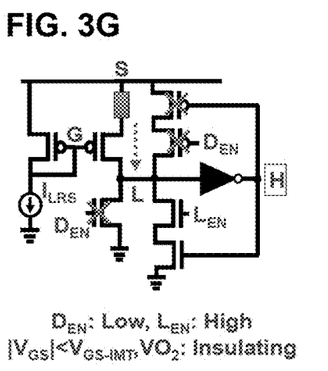

Furthermore, when $I_{CELL}=I_{HRS}$, the amplifier 100 functions as shown in FIGS. 3E-3G. As the amplifier circuit and components thereof are such that $(V_{DD}-V_{G-HRS})<|V_{GS-IMT}|$ by design, IMT is not triggered in the PTM when $I_{CELL}=I_{HRS}$. As a result, the Hyper-FET 112 can only supply very low current to node 115 due to the high insulating state resistance of the PTM 107 (e.g., $VO_2$ having a HRS resistance of approximately 0.3MΩ in one example). The Hyper-FET 112 nonetheless tries to pull up the voltage at node 115, as shown in FIGS. 3E and 3F, but the time constant for charging the node is extremely high. In this situation, the $L_{EN}$ signal is used to latch the output after a certain time during sensing. Since node 115 was pre-discharged to 0 before the sensing operation and $V_O$ was pulled-up to $V_{DD}$ before the sensing operation, transistor 122 operates in the ON state. Hence, as $L_{EN}$ is asserted (as shown in FIG. 3G), transistors 121 and 122 pull down the voltage at node 115 and latch the output. A high voltage signal 'H' is thereby latched at the output node 103.

In operation of the amplifier 100, the time to assert $L_{EN}$ marks the end time for sensing and is determined according to the time constant of the LRS sensing operation. While sensing LRS, the PTM 107 (e.g., $VO_2$) has to transition into metallic state to trigger the desired output change. Hence, the time taken for the IMT is the major contributor to the total sense time. In operation of the circuit, $L_{EN}$ is asserted when the PTM 107 completes transitioning into the metallic state. In this regard, the sense time for the amplifier circuit 100 can be formulated as:

$$T_{SENSE} = T_{SET\ UP:ICELL} + T_{IMT} + T_{MARGIN}$$

Here, $T_{SET\ UP}:I_{CELL}$ is the setup time for $I_{CELL}$. After assertion of a word line for sensing, the cell current ($I_{CELL}$) generally requires some time to reach its stable value. $T_{SET\ UP}:I_{CELL}$ accounts for that time span. $T_{IMT}$ is the IMT transition time. The IMT transition time is generally in the range of 50 ps to 10 ns, although in some examples the IMT transition time may be less than 50 ps or more than 10 ns depending on the type of PTM used and the PTM's dimensions. In one experimental design, the IMT transition time was determined to be approximately 50 ps for $VO_2$ with the dimensions of the PTM 107 used in the one design based on projections from experimental data. $T_{MARGIN}$ is the safety time lag that provides a delay before asserting $L_{EN}$. The time lag is used to let the node 115 charge up and cross the logic threshold voltage level of the inverter 117 to start changing the output $V_O$. In general, the sensing time is determined according to the circuit function under LRS sensing because the output never changes from its pre-set value ($V_{DD}$) during HRS sensing.

The operation of the amplifier 100 is controlled in part by a controller outputting the $D_{EN}$ and $L_{EN}$ control signals, an example of which is detailed in further detail below.

Figure 4A:
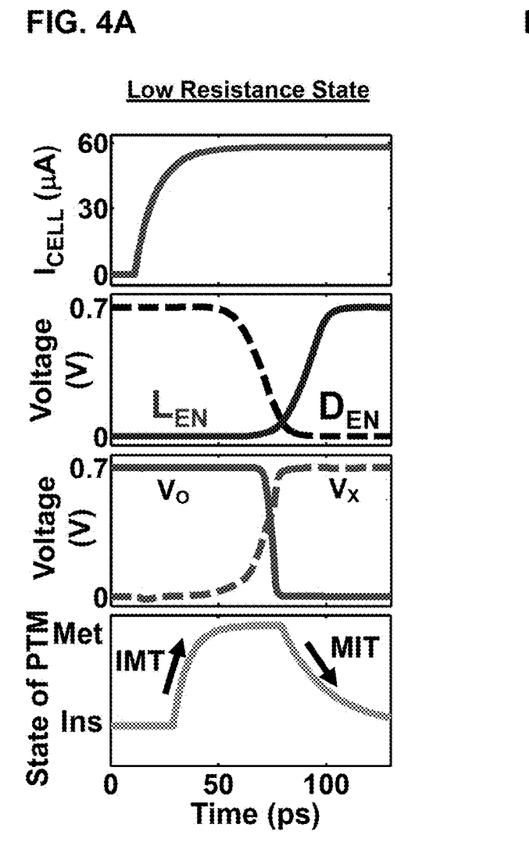
FIGS. 4A and 4B are plots of signals in the sense amplifier circuit of FIG. 1 during operation of the sense amplifier circuit.
Figure 4B:
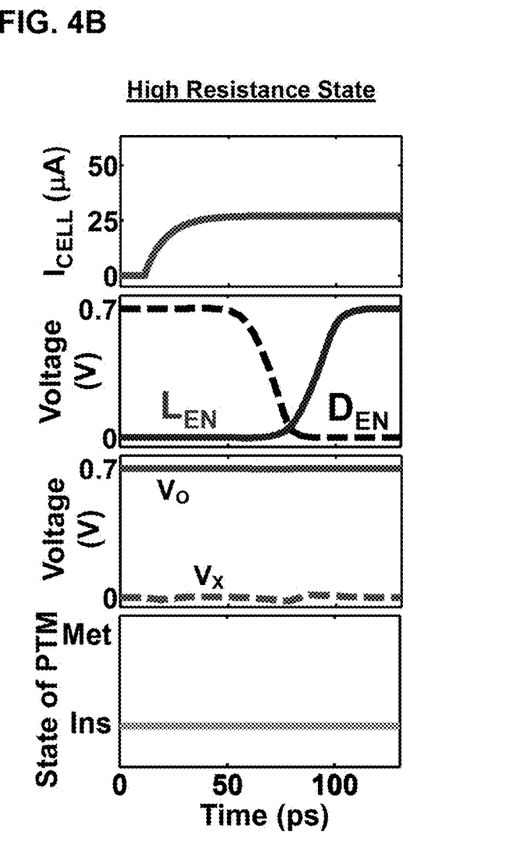

FIGS. 4A and 4B are signal diagrams showing current and voltage levels in the amplifier 100 over time during a sensing operation. The signal diagrams show the signals $I_{CELL}$, $L_{EN}$ and $D_{EN}$, the voltages $V_X$ at node 115 and $V_O$ at node 103, and the state (insulating, 'Ins', or metallic, 'Met') of the PTM 107 during a LRS sensing operation (FIG. 4A) and during a HRS sensing operation (FIG. 4B). As shown, the transient waveforms of FIG. 4A show the ramping up of the cell current $I_{CELL}$ at the beginning of the LRS sense cycle (FIG. 4A), where the cell current $I_{CELL}$ reaches a relatively high level (due to the low resistance of the memory element); the de-assertion (high-to-low signal transition) of $D_{EN}$ to start sensing and the assertion (low-to-high signal transition) of $L_{EN}$ to latch the sensed data; the change in the sense node 115 (Node:X) due to fast charging up and the corresponding transition at the inverter output node 103 (Node:O); and the corresponding transition in state of the PTM 107 illustrating IMT and MIT transitions over time. The sense decision is made when the PTM 107 is in the metallic state.

During a HRS sensing operation (FIG. 4B), the cell current $I_{CELL}$ reaches a relatively low level due to the high resistance (e.g., HRS) of the memory element; in this case, the assertion and de-assertion of $L_{EN}$ and $D_{EN}$ follow the same profiles as those of FIG. 4A; however, there is no change at the output node 103 (Node:O) as the voltage at the sense node 115 (Node:X) cannot charge up within the sensing time window (i.e., before $L_{EN}$ goes high); as a result, the PTM 107 remains in insulating state throughout the entire time.

As detailed above, the amplifier 100 uses the Hyper-FET 112 and its PTM 107 to distinguish between the LRS and HRS current levels of $I_{CELL}$ and thereby determine the data bit stored by the currently-accessed memory storage location. The amplifier 100 does not require any external reference circuit or source to distinguish between the two current levels of $I_{CELL}$. Instead, the '$V_{GS\text{-}IMT}$' threshold of the PTM 107 is itself the reference for differentiating between HRS and LRS. As such, to successfully achieve the proposed functionality from the circuit 100 as discussed above, proper co-design between the PTM 107, the associated circuit elements, and an associated memory circuit is required. For this purpose, a transient simulation can be used as detailed below.

For the analysis of the PTM 107 (e.g., formed of $VO_2$), a phenomenological resistive model can be used for simulating the characteristics of the PTM 107 and designing the associated sense amplifier 100. The model considers different resistivities of PTM 107 in the metallic and insulating states and switches state in response to critical current thresholds. The material parameters used in the model of the PTM 107 (e.g., $VO_2$) can be extracted from epitaxial films of the PTM (e.g., $VO_2$ films) grown on a titanium (Ti) substrate (e.g., a $TiO_2$ substrate) using reactive oxide molecular beam epitaxy. Material parameters for one illustrative example are provided below in Table I. In the example associated with Table I, the magnetic tunnel junction (MTJ) memory is associated with the following parameter values: diameter of 40 nm; thickness of free layer of 1.5 nm; MgO thickness of 1.1 nm; saturation magnetization of 700 KA/m; energy barrier or 56KBT; and Gilbert damping of 0.028. However, these parameters are not restrictive, and other parameter values can be used. The parameters are then used to calibrate a model with the experimental PTM's I-V data. A predictive technology model was used to simulate a 14 nm FinFET transistor characteristic and evaluate the proposed sense amplifier. For one illustrative memory element, a STT MRAM model was used, although the proposed circuit can be used for any other non-volatile memory technology.

TABLE I

Simulation Parameters

| | |
|---|---|
| $\rho_{INSULATOR}$ | $1\ \Omega \cdot cm$ |
| $\rho_{METAL}$ | $5 \times 10^{-3}\ \Omega \cdot cm$ |
| $J_{C\text{-}IMT}$ | $8 \times 10^4\ A/cm^2$ |
| $J_{C\text{-}MIT}$ | $1 \times 10^6\ A/cm^2$ |
| $L_{PTM}, A_{PTM}$ | 42 nm, 1260 $nm^2$ |
| Technology | 14 nm FinFET |
| Memory | Magnetic Tunnel Junction |
| $V_{DD}$ | 0.7 V |

Figure 5A:
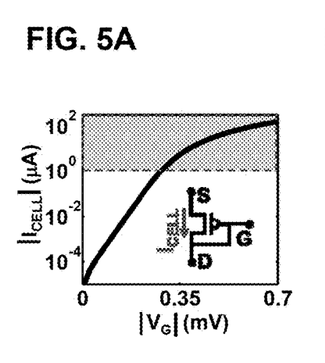
FIGS. 5A-5C are plots illustrating characteristics of the diode connected transistor of the sense amplifier circuit of FIG. 1.
Figure 5B:
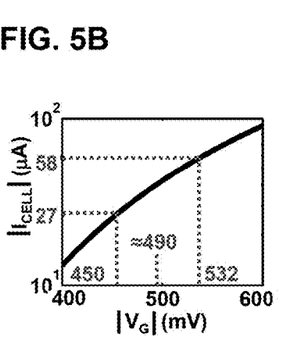
Figure 5C:
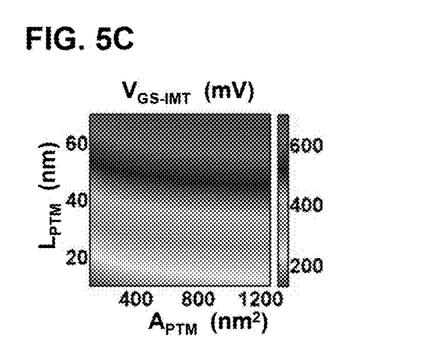

Based on the model and simulation, the I-V transfer characteristics of the diode connected transistor 109 (as shown in FIGS. 5A and 5B) were analyzed to find the values of $V_G$ that occur in transistor 109 in response to currents of intensities $I_{LRS}$ and $I_{HRS}$ (e.g., 27 uA and 58 uA in the example of FIG. 5B) flowing. The current intensities $I_{LRS}$ and $I_{HRS}$ may be selected as current intensities associated with an STT MRAM, for example. In turn, a target $V_{GS\text{-}IMT}$ (e.g., 490 mV) keeping equal margin from $V_{G\text{-}HRS}$ and $V_G$-LRS can be selected. In one example, to achieve the targeted $V_{GS\text{-}IMT}$, a mapping of $V_{GS\text{-}IMT}$ was generated in relation to the area and length of $VO_2$, as shown in FIG. 5C. Using the mapping, the dimensions of the PTM 107 were selected to yield the desired $V_{GS\text{-}IMT}$ (e.g., approximately 490 mV in one example). Transient simulations were then performed for memory cells storing LRS and HRS. The diagrams shown in FIGS. 4A and 4B were obtained as a result of such simulations. FIG. 4A shows a simulation in which $I_{CELL}=I_{LRS}$ (low resistance state), and the figure shows control signal assertion ($L_{EN}$, $D_{EN}$), change in output, and the state switching in PTM. FIG. 4B shows similar information for a simulation in which $I_{CELL}=I_{HRS}$ (high resistance state). In case of HRS sensing, the gate input to the Hyper-FET 112 does not reach up to $V_{GS\text{-}IMT}$ and hence the Hyper-FET passes only a very small amount of current. As a result, node 115 ($V_X$) cannot rise up to a high value. From a different angle, during LRS sensing, node 115 ($V_X$) gets charged by the ON current of the Hyper-FET 112 (in contrast, for HRS, only the OFF current of the Hyper-FET 112 charges node 115). As a result, the large current flow into node 115 during LRS sensing shortens the charging time constant (in contrast, $V_X$ at node 115 never considerably charges up in HRS sensing). Finally, the latching action by the inverter 117 provided by $L_{EN}$ transition to a high level restricts gradual rise of $V_X$ after the end of sensing.

Figure 6A:
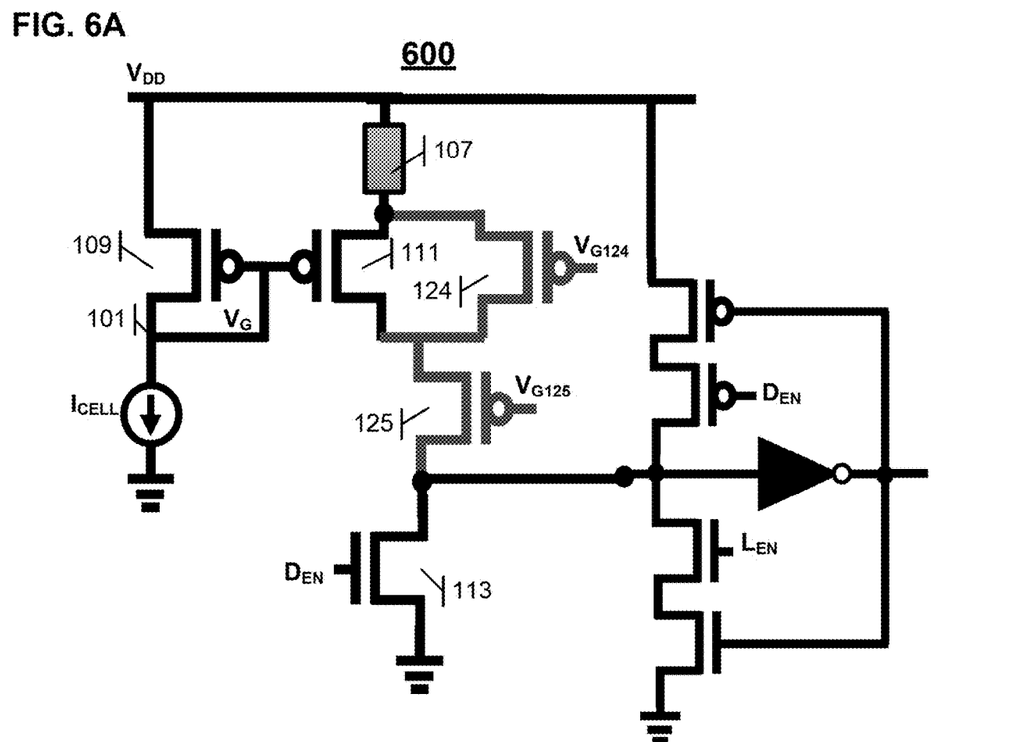
FIG. 6A is a circuit diagram of another illustrative low power sense amplifier having operation based on a PTM.
Figure 6B:
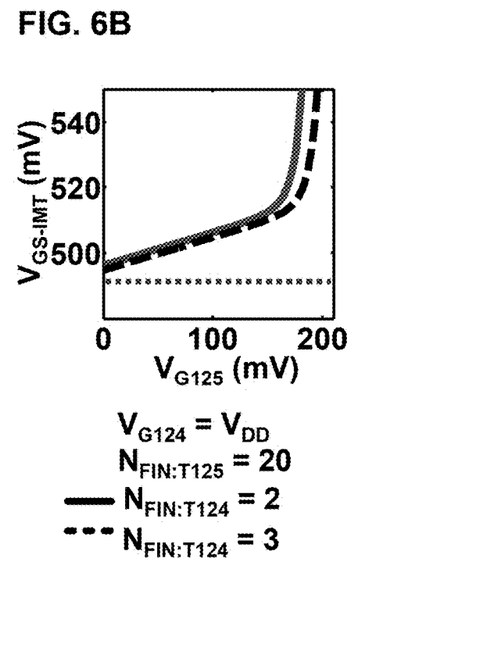
FIGS. 6B and 6C are plots illustrating behavior of the sense amplifier circuit of FIG. 6A.
Figure 6C:
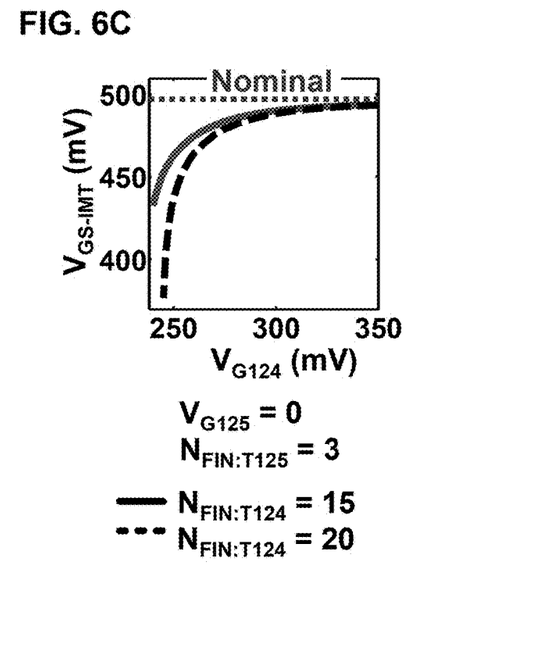

The foregoing description has focused on a circuit in which the amplifier 100 does not require any external reference circuit or source to distinguish between the two current $I_{CELL}$ levels. Instead, the '$V_{GS\text{-}IMT}$' threshold of the PTM 107 is itself the reference for differentiating between HRS and LRS. As an alternative, the modified amplifier circuit 600 of FIG. 6A can be used to provide the ability to dynamically tune the $V_{GS\text{-}IMT}$ reference. The approach can advantageously be used to counter global process variations, for example. In the design of FIG. 6A, the $V_{GS\text{-}IMT}$ threshold can be changed according to the global process corner. As shown in FIG. 6A, two additional PMOS transistors 124 and 125 are used to change $V_{GS\text{-}IMT}$ dynamically by changing the gate bias (of PMOS transistors 124 and 125). The purpose of using the transistors 124 and 125 is to tailor the resistive voltage division between the PTM 107 and the transistor. Transistor 124, being in parallel with the host transistor 111 of the Hyper-FET 112, can reduce the resistance of the combination if biased properly in the linear region of operation. In contrast, transistor 125 is in series with the host transistor 111 and increases the resistance of the combination. $V_{GS\text{-}IMT}$ is determined by the relative resistance of the PTM 107 and its host transistor 111 in the Hyper-FET 112. Here, by manipulating the transistors' resistances, the circuit 600 of FIG. 6A can be used to tune $V_{GS\text{-}IMT}$. In particular, the transistor 124 can be used to reduce $V_{GS\text{-}IMT}$ in case the global variations lead to reduction in the cell currents. Conversely, transistor 125 can be used to increase $V_{GS\text{-}IMT}$ from the nominal value at a fast process corner. The responsiveness of $V_{GS\text{-}IMT}$ to the gate bias of these tuning transistors is illustrated in FIGS. 6B and 6C. In the figures, $V_{G124}$ and $V_{G125}$ are the gate voltages of transistors 124 and 125, respectively, and $N_{FIN}$ identifies the number of fins for each transistor (T124, T125). As is shown in FIGS. 6B and 6C, using a lower number of fins is beneficial for transistor 125, since the lower number of fins increases the transistor's resistance and makes it more influential over transistor 111. However, transistor 124 generally is selected to have a higher number of fins so that it can sufficiently contribute to reducing the overall resistance of the parallel combination of transistors.

Figure 7A:
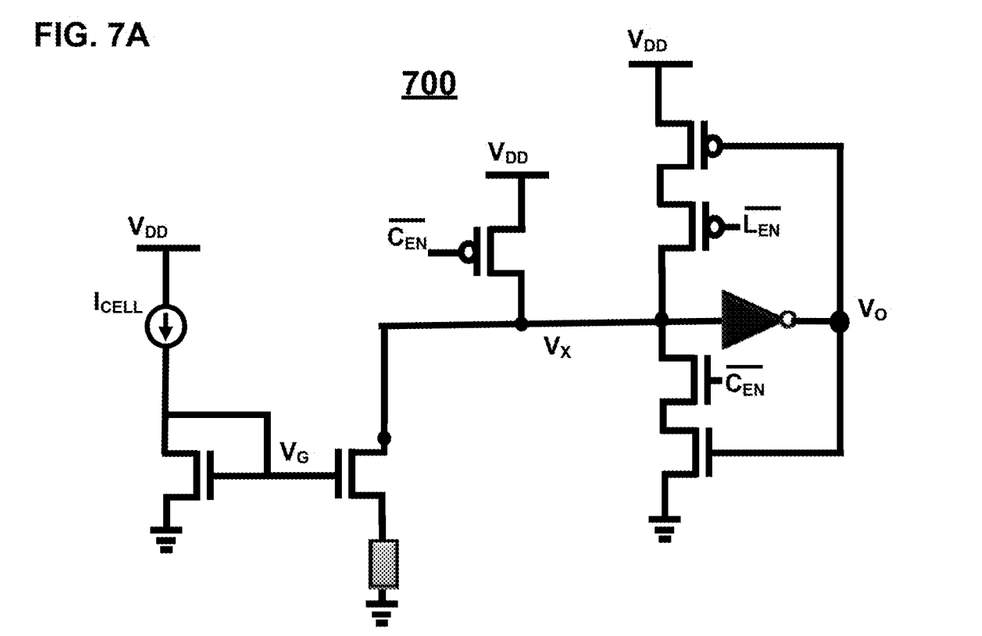
FIGS. 7A and 7B are circuit diagrams of other illustrative low power sense amplifiers having operation based on a PTM.
Figure 7B:
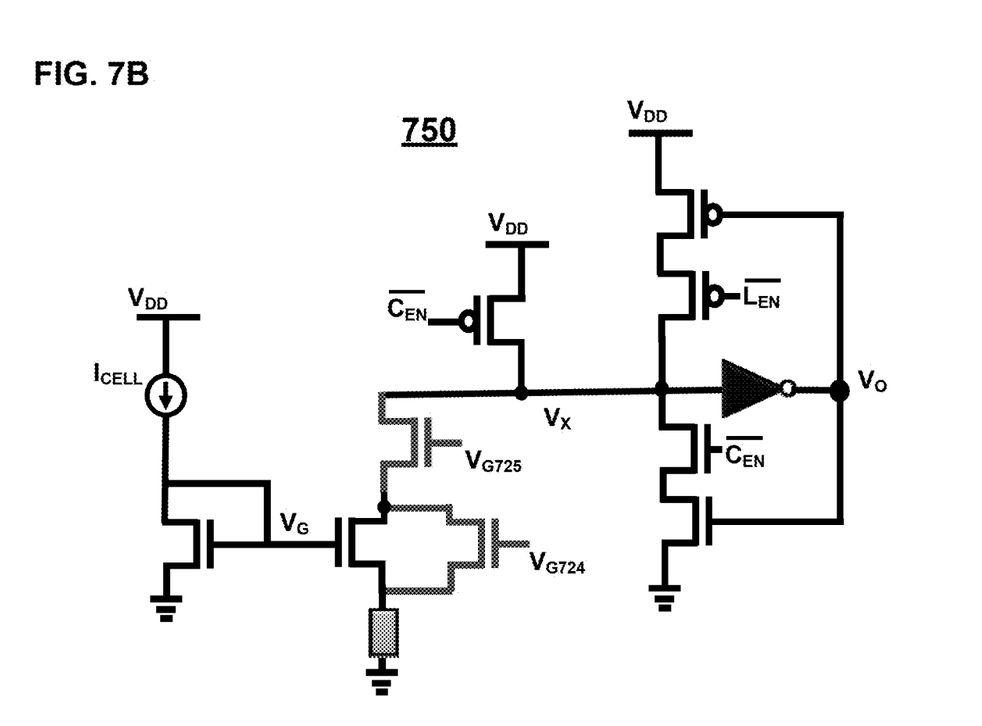

The sense amplifiers 100/600 described above in relation to FIGS. 1 and 6A include a P-type diode-connected transistor 109 and a P-type transistor 111 within the Hyper FET 112. More generally, however, N-type transistors can be used. For example, as shown in FIGS. 7A and 7B, two further examples of sense amplifier circuits 700 and 750 are provided. In FIG. 7A, a sense amplifier 700 is provided that is substantially similar to sense amplifier 100 but in which complementary types of capacitors are used (e.g., N-type transistors are replaced by P-type transistors, and vice versa); similarly in FIG. 7B, a sense amplifier 750 is provided that is substantially similar to sense amplifier 600 but in which complementary types of capacitors are used. The function of sense amplifiers 700 and 750 is substantially similar to the operation of sense amplifiers 100 and 600 except that complementary control signals $\overline{C_{EN}}$ and $\overline{L_{EN}}$ are used (where $C_{EN}$, the charge enable signal used in amplifiers 700 and 750, has the same timing of activation/deactivation discussed above as $D_{EN}$ during a memory read operation, and $\overline{C_{EN}}$ is complementary to $C_{EN}$ (and $D_{EN}$), and where $\overline{L_{EN}}$ is complementary to $L_{EN}$ whose timing of activation/deactivation is discussed above during a memory read operation).

Figure 8:
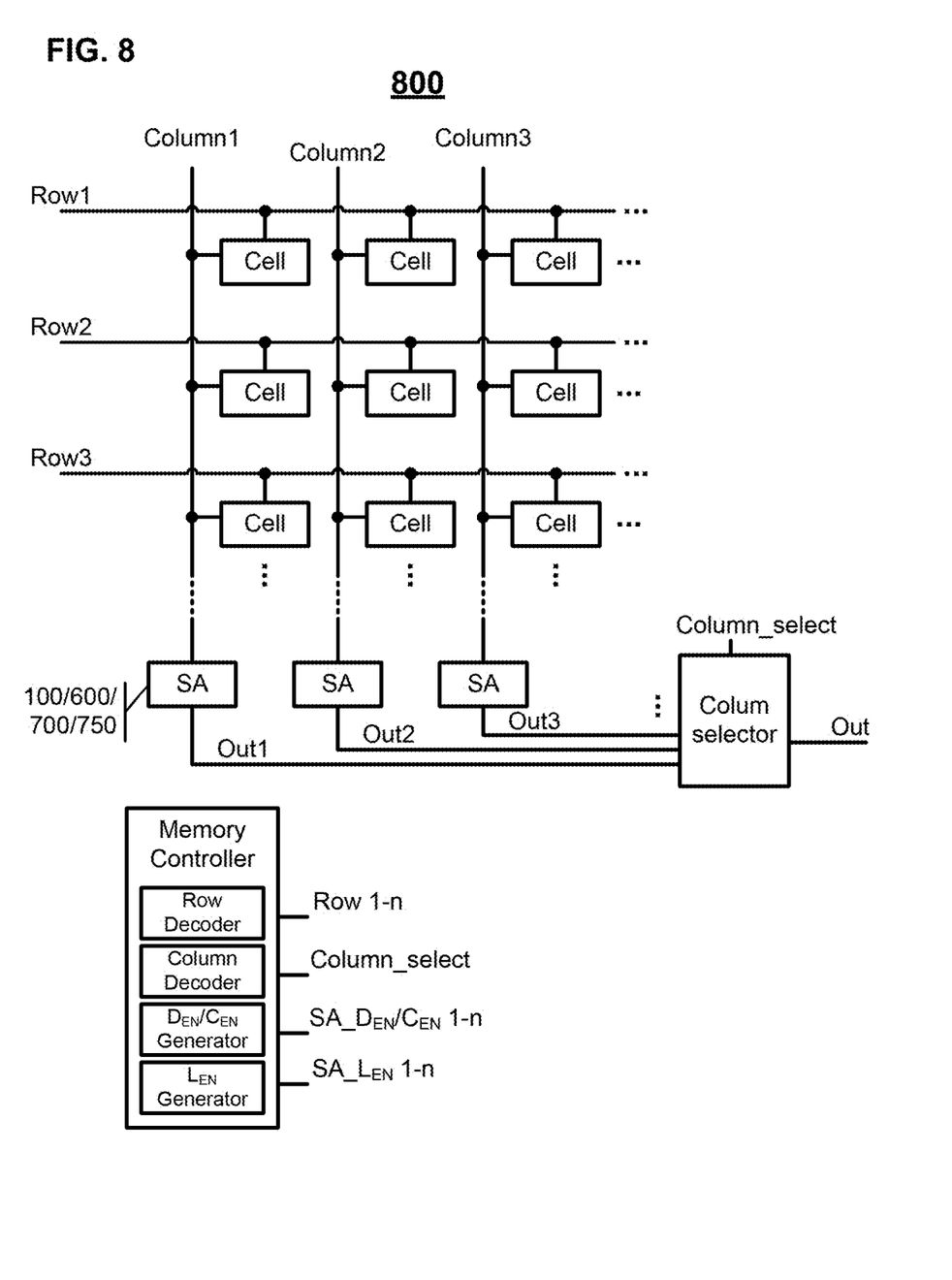
FIG. 8 is a schematic diagram of a memory that includes sense amplifiers such as those shown in FIG. 1, 6A, 7A, or 7B.

As described above, the sense amplifier circuits 100, 600, 700, and 750 can be used in a variety of applications including memory-based application. By way of example, FIG. 8 shows an illustrative memory 800 that includes sense amplifiers 100/600/700/750 functioning as current sense amplifiers as described above. As shown, the memory 800 includes an array of memory cells (e.g., non-transitory memory cells) each configured to store a bit of memory. Each memory cell is connected to a row line and a column line used to address the memory cell during operations to write to or read from the memory cell. In the example, each column of memory cells is connected to a same sense amplifier 100/600/700/750. To perform a memory read operation, the row line associated with the memory cell to be read is held high to cause a current $I_{CELL}$ to flow through the memory cell. If the cell is in a low resistance state (LRS), the relatively large current that flows through the cell is sensed by the sense amplifier corresponding to the column of the memory cell; conversely, if the cell is in a high resistance state (HRS), the relatively small current that flows through the cell is sensed by the sense amplifier corresponding to the column. A determination of the bit stored by the memory cell is thus determined at the output of the sense amplifier 100/600/700/750. A column selector selects the output of the sense amplifier 100/600/700/750 associated with the desired column for output from the memory array.

To perform the functions described above, the memory includes a memory controller coupled to the row lines, column lines, and sense amplifiers. The memory controller may include a row controller configured to apply voltage to the appropriate row (through one of the "Row 1-$n$" signals) in order to select the memory cells in the row for a read operation. In turn, while the Row line signal is held high, $D_{EN}/C_{EN}$ and $L_{EN}$ generator circuits may apply the $D_{EN}/C_{EN}$ and $L_{EN}$ signals to the appropriate sense amplifier 100/600/700/750 in order to read the bit stored in the memory cell and latch the read value at the sense amplifier's output, as described in further detail above. The memory controller may also include a column selector configured to select, from among the outputs of the sense amplifiers, the output of one sense amplifier for output from the memory array.

While the embodiment of FIG. 8 includes a separate sense amplifier 100/600/700/750 for each column, in an alternate embodiment the column selector may have its inputs connected to each of the column lines (Column 1-$n$) and have its output connected to a single sense amplifier 100/600/700/750 used to read the bit stored in each memory cell and latch the read value at the sense amplifier's output, as described in further detail above.

The amplifiers 100/600/700/750 can also be used in other applications including in processors, neural networks, wearable electronic systems, internet of things (IoT), health monitoring systems, and the like. For example in the case of neural networks, an amplifier 100/600/700/750 can be used to determine whether a sum of signals received at node 101 from connected neurons falls below or exceeds a threshold (e.g., a threshold determined according to the $V_{GS\text{-}IMT}$ threshold of the Hyper-FET).

The present disclosure details a novel sense amplifier topology based on a phase transition material (PTM) used in conjunction with the CMOS circuits. The amplifier design utilizes the orders-of-magnitude difference in the currents in the two phases and abrupt transitions in the PTM to achieve low power and low area. Since the proposed design uses the inherent switching threshold of the PTM as the reference for sensing, no separate reference is required. The amplifier thereby provides a robust and precise sensing threshold that can be used in non-volatile memories (e.g., MRAMs, resistive RAMs, phase change memories, and the like) as well as other applications.

The sense amplifiers 100/600/700/750 described herein can function as current sense amplifiers through the use of a diode-connected transistor (e.g., 109) having its gate and drain nodes connected to the input node (e.g., 101) of the sense amplifier. In such applications, the sense amplifier is operative to output at the output node a sense amplifier output signal indicative of a current level sensed at the input node of the sense amplifier. More generally, however, the sense amplifiers 100/600/700/750 can be used as voltage sense amplifiers. In voltage sensing applications, the diode-connected transistor (e.g., 109) may be removed such that only the gate of the Hyper-FET or Phase FET (e.g., 112) is connected to the input node (e.g., 101) of the sense amplifier. In such applications, the sense amplifier circuitry is operative to output at the output node a sense amplifier output signal indicative of a voltage level sensed at the input node of the sense amplifier.

Only the preferred embodiment of the present invention and examples of its versatility are shown and described in the present disclosure. It is to be understood that the present invention is capable of use in various other combinations and environments and is capable of changes or modifications within the scope of the inventive concept as expressed herein. Thus, for example, those skilled in the art will recognize, or be able to ascertain, using no more than routine experimentation, numerous equivalents to the specific substances, procedures and arrangements described herein. Such equivalents are considered to be within the scope of this invention, and are covered by the following claims.

What is claimed is:

1. A sense amplifier comprising:
   a first diode-connected NMOS transistor having gate and drain nodes coupled to an input node of the sense amplifier;

a second NMOS transistor having a gate node coupled to the gate node of the first diode-connected transistor; and a phase transition material (PTM), configured to be in a metallic phase only while a stimulus is applied thereto that meets or exceeds a transition threshold for transitioning the PTM to the metallic phase, the PTM transitioned to an insulating phase and remaining in the insulating phase when the stimulus is absent, the PTM having a first terminal coupled to the source node of the second NMOS transistor and a second terminal coupled to a power supply node.

2. The sense amplifier of claim 1, further comprising: a sense amplifier output stage coupled between a drain node of the second NMOS transistor and an output node of the sense amplifier, and configured to output at the output node a sense amplifier output signal indicative of a level of a sensed signal at the input node of the sense amplifier.

3. The sense amplifier of claim 1, wherein the PTM comprises $VO_2$, $NbO_2$, or silver doped hafnium oxide.

4. The sense amplifier of claim 1, wherein the PTM transitions from the insulating phase to the metallic phase only when a level of current flows through the PTM that exceeds the transition threshold.

5. The sense amplifier of claim 4, wherein the PTM has an impedance that varies non-linearly relative to a current flow through the PTM.

6. The sense amplifier of claim 2, wherein the sense amplifier output stage comprises:
an inverter coupled between the drain node of the second NMOS transistor and the output node of the sense amplifier; and
a first P-type transistor coupled between the drain node of the second NMOS transistor and a power supply node.

7. The sense amplifier of claim 6, wherein the sense amplifier output stage further comprises:
a series interconnection of first and second N-type transistors and second and third P-type transistors coupled between a ground node and the power supply node, wherein:
the drain node of the second NMOS transistor is coupled to a node common to the second N-type transistor and second P-type transistor; and
gate nodes of the first N-type transistor and third P-type transistor are coupled to the output node of the sense amplifier.

8. The sense amplifier of claim 7, further comprising a controller outputting a signal complementary to a charge enable signal to gate nodes of the first P-type transistor and the second N-type transistor, and outputting a signal complementary to a latching enable signal to a gate node of the second P-type transistor.

9. A non-volatile memory comprising:
an array of non-volatile memory cells each operative to store a respective data bit;
control circuitry configured to select a memory cell to be read; and
a sense amplifier comprising a phase transition material (PTM) configured to be in a metallic phase only while a stimulus is applied thereto that meets or exceeds a transition threshold for transitioning the PTM to the metallic phase, the PTM transitioned to an insulating phase and remaining in the insulating phase when the stimulus is absent,
wherein the sense amplifier is configured to sense the data bit stored by the memory cell selected to be read, and the sense amplifier includes a first diode-connected NMOS transistor having gate and drain nodes coupled to a sense amplifier input node, a second NMOS transistor having a gate node coupled to the gate node of the first diode-connected transistor, and the PTM having a first terminal coupled to the source node of the second NMOS transistor and a second terminal coupled to a power supply node.

10. The non-volatile memory of claim 9, wherein the sense amplifier further comprises:
an output stage coupled between a drain node of the second NMOS transistor and an output node of the sense amplifier, and configured to output at the output node of the sense amplifier a sense amplifier output signal indicative of the sensed data bit stored by the memory cell selected to be read.

11. The non-volatile memory of claim 9, wherein the sense amplifier comprises a Hyper-FET or Phase FET comprising the PTM.

12. The non-volatile memory of claim 9, wherein the PTM comprises $VO_2$, $NbO_2$, or silver doped hafnium oxide.

13. The non-volatile memory of claim 9, wherein the PTM transitions between a metallic state and an insulating state according to a level of current flow through the PTM.

14. A sense amplifier comprising:
a first NMOS transistor having a gate node coupled to an input node of the sense amplifier;
a phase transition material (PTM), having an insulator-to-metal transition (IMT) threshold voltage and a metal-to-insulator transition (MIT) threshold voltage of a same polarity, having a first terminal coupled to the source node of the first NMOS transistor and a second terminal coupled to a power supply node;
the PTM configured to be in a metallic phase only while a stimulus is applied thereto that meets or exceeds the IMT for transitioning the PTM to the metallic phase, the PTM transitioned to an insulating phase and remaining in the insulating phase when the stimulus is absent; and
a sense amplifier output stage coupled between a drain node of the first NMOS transistor and an output node of the sense amplifier, and configured to output at the output node a sense amplifier output signal indicative of a level of a sensed signal at the input node of the sense amplifier.

15. The sense amplifier of claim 14, wherein the PTM comprises $VO_2$, $NbO_2$, or silver doped hafnium oxide.

16. The sense amplifier of claim 14, wherein the PTM transitions from the insulating state to the metallic state only when a level of current flow through the PTM exceeds the IMT.

17. The sense amplifier of claim 14, wherein the sense amplifier output stage comprises:
an inverter coupled between the drain node of the first NMOS transistor and the output node of the sense amplifier; and
a first P-type transistor coupled between the drain node of the first NMOS transistor and a power supply node.

18. The sense amplifier of claim 17, wherein the sense amplifier output stage further comprises:
a series interconnection of first and second N-type transistors and second and third P-type transistors coupled between a ground node and the power supply node, wherein:
the drain node of the first NMOS transistor is coupled to a node common to the second N-type transistor and second P-type transistor; and gate nodes of the first N-type transistor and third P-type transistor are coupled to the output node of the sense amplifier.

19. The sense amplifier of claim 18, further comprising a controller outputting a signal complementary to a charge enable signal to gate nodes of the first P-type transistor and the second N-type transistor, and outputting a signal complementary to a latching enable signal to a gate node of the second P-type transistor.

20. The sense amplifier of claim 16, comprising a Hyper-FET or Phase FET comprising the PTM.

* * * * *